United States Patent
Mohindra et al.

[19]

[11] Patent Number: 5,873,947
[45] Date of Patent: Feb. 23, 1999

[54] ULTRA-LOW PARTICLE DISK CLEANER

[75] Inventors: Raj Mohindra, Los Altos; Abhay Bhushan, Palo Alto; Rajiv Bhushan, Mountain View; Suraj Puri, Los Altos; John H. Anderson, Sr., Milpitas; Jeffrey Nowell, San Francisco, all of Calif.

[73] Assignee: YieldUP International, Mountain View, Calif.

[21] Appl. No.: 907,322

[22] Filed: Aug. 6, 1997

Related U.S. Application Data

[63] Continuation-in-part of Ser. No. 555,634, Nov. 8, 1995, Pat. No. 5,772,784, which is a continuation-in-part of Ser. No. 437,541, May 9, 1995, Pat. No. 5,571,337, which is a continuation-in-part of Ser. No. 339,326, Nov. 14, 1994, Pat. No. 5,634,978.

[51] Int. Cl.$^6$ ........................................................ B08B 3/04
[52] U.S. Cl. ........................ 134/18; 134/56 R; 134/25.4; 134/902; 134/95.2
[58] Field of Search .................................. 134/135, 95.2, 134/95.3, 102.3, 25.4, 25.5, 30, 902, 56 R, 57 R, 58, 18

[56] References Cited

U.S. PATENT DOCUMENTS

| | | | |
|---|---|---|---|
| 4,633,893 | 1/1987 | McConnell et al. | 134/95 |
| 4,750,505 | 6/1988 | Inuta et al. | 134/153 |
| 4,778,532 | 10/1988 | McConnell et al. | 134/10 |
| 4,871,417 | 10/1989 | Nishiawa et al. | 156/640 |

(List continued on next page.)

FOREIGN PATENT DOCUMENTS

| | | | |
|---|---|---|---|
| 385 536 | of 0000 | European Pat. Off. . | |
| 60-245136 | 12/1985 | Japan | 134/902 |
| 61-46016 | 6/1986 | Japan . | |
| 61-88534 | 6/1986 | Japan . | |

(List continued on next page.)

OTHER PUBLICATIONS

M. Itano, F.W. Kern, Jr., R.W. Rosenberg, M. Miyashita, I. Kawanabe, and T. Ohmi, "Particle Deposition and Removal in Wet Cleaning Processes for ULSI Manufacturing", IEEE Trans. on Semiconductor Manufacturing, vol. 5, No. 2, pp. 114–120, May 1992.

Y. Yagi, T. Imaoka, Y. Kasama, and T. Ohmi, "Advanced Ultrapure Water Systems with Low Dissolved Oxygen for Native Oxide Free Wafer Processing", IEEE Trans. On Semiconductor Manufacturing, vol. 5, No. 2, pp. 121–127, May 1992.

H.G. Parks, J.F. O'Hanlon, and F. Shadman, "Research Accomplishments at the University of Arizona Sematech Center of Excellence for Contamination/Defect Assessment and Control", IEEE Trans. on Semiconductor Manufacturing, vol.6 No. 2, pp. 134–142, May 1993.

C.S. Ackerman and J.M. Fabia, "Monitoring Supplier Quality at PPM Levels", IEEE Trans. on Semiconductor Manufacturing, vol. 6. No. 2, pp. 189–194, May 1993.

G.D. Moss, J.N. DiBello, K.P. Yanders, and R.F. Orr, "Capillary Drying: Particle–Free Wet–Process Drying?".

T. Ohmi, Ultra Clean Technology Handbook, p. 290, 1993.

(List continued on next page.)

*Primary Examiner*—Frankie L. Stinson
*Attorney, Agent, or Firm*—Townsend and Townsend and Crew LLP

[57] ABSTRACT

A technique for cleaning a hard disk using a novel support device 502. The technique includes immersing a disk in a liquid comprising water. The disk has a front face, a back face, an edge, and a center region. The method also includes providing a substantially particle free environment adjacent to the front face and the back face as the liquid is being removed. A step of introducing a carrier gas comprising a cleaning enhancement substance during the providing step also is included. The cleaning enhancement substance dopes the liquid which is attached to the front face and the back face to cause a concentration gradient of the cleaning enhancement substance in the attached liquid to accelerate fluid flow of the attached liquid off of the disk.

43 Claims, 8 Drawing Sheets

U.S. PATENT DOCUMENTS

| | | | |
|---|---|---|---|
| 4,874,014 | 10/1989 | Grant et al. | 137/606 |
| 4,911,761 | 3/1990 | McConnell et al. | 134/11 |
| 4,917,123 | 4/1990 | McConnell et al. | 134/95 |
| 4,984,597 | 1/1991 | McConnell et al. | 134/95 |
| 4,987,687 | 1/1991 | Sugimoto | 34/58 |
| 5,022,419 | 6/1991 | Thompson et al. | 134/902 |
| 5,082,518 | 1/1992 | Molinaro | 156/345 |
| 5,129,955 | 7/1992 | Tanaka | 134/2 |
| 5,156,174 | 10/1992 | Thompson et al. | 134/153 |
| 5,169,408 | 12/1992 | Biggerstaff et al. | 29/250.1 |
| 5,190,064 | 3/1993 | Aigo | 134/902 |
| 5,191,908 | 3/1993 | Hiroe et al. | 134/902 |
| 5,228,206 | 7/1993 | Grant et al. | 34/1 |
| 5,271,774 | 12/1993 | Leenaars et al. | 134/31 |
| 5,286,657 | 2/1994 | Bran | 437/9 |
| 5,301,701 | 4/1994 | Nafziger | 134/95.2 |
| 5,315,766 | 5/1994 | Roberson, Jr. et al. | 34/409 |
| 5,339,539 | 8/1994 | Shiraishi et al. | 34/58 |
| 5,421,905 | 6/1995 | Ueno et al. | 134/25.4 |
| 5,459,943 | 10/1995 | Tanahashi . | |
| 5,482,068 | 1/1996 | Kitahara et al. | 134/902 |

FOREIGN PATENT DOCUMENTS

| | | | |
|---|---|---|---|
| 62-188323 | 8/1987 | Japan . | |
| 3-127847 | 5/1991 | Japan | 134/902 |
| 4-833400 | 3/1992 | Japan . | |
| 4-151835 | 5/1992 | Japan | 134/902 |
| 4-192419 | 7/1992 | Japan . | |
| 4-233747 | 8/1992 | Japan | 134/902 |
| 4-241417 | 8/1992 | Japan | 134/902 |
| 4-251930 | 9/1992 | Japan . | |
| 4-323824 | 11/1992 | Japan | 134/902 |
| 5-283386 | 10/1993 | Japan . | |
| 5-283391 | 10/1993 | Japan . | |
| 5-326464 | 12/1993 | Japan . | |
| 6-120185 | 4/1994 | Japan | 134/902 |
| 6-177107 | 6/1994 | Japan . | |
| 6-196401 | 7/1994 | Japan . | |
| 2126710 | 3/1984 | United Kingdom | 134/902 |

OTHER PUBLICATIONS

J. Marra, "Ultra Clean Marangoni Drying", pp. 269–282.

C. McConnell, "Examining the Effects of Wafer Surface Chemistry on Particle Removal Using Direct–Displacement Isopropyl Alcohol Drying", MicroContamination, Feb. 1991.

P. Burggraaf, "Keeping the 'RCA' in Wet Chemistry Cleaning", Semiconductor International, pp. 86–90, Jun. 1994.

M.B. Olesen, "A Comparative Evaluation of the Spin Rinser/Dryer with the IPA Vapor Isodry Technique", Proceedings—Institute of Environmental Sciences, pp. 229–241, 1990.

D.J. Riley and R.G. Carbonell, "The Deposition of Contaminants from Deionized Water onto Hydrophobic Silicon Wafers", Journal of the IES, pp. 28–34, Nov./Dec. 1991.

N.D. Casper and B.W. Soren, "Semiconductor Yield Enhancement through Particle Control", Emerging Semiconductor Technology, pp. 423–435.

ULTRA-LOW PARTICLE DISK CLEANER

CROSS-REFERENCE TO RELATED APPLICATIONS

This application is a continuation-in-part of application Ser. No. 08/555,634 filed Nov. 8, 1995 now U.S Pat. No. 5,772,784, which is a continuation-in-part of application Ser. No. 08/437,541, filed May 9, 1995 now U.S. Pat. No. 5,571,337, which is a continuation-in-part of application Ser. No. 08/339,326, filed Nov. 14, 1994, now U.S. Pat. No. 5,634,978, all in the name of the present assignee, and all hereby incorporated by reference for all purposes.

BACKGROUND OF THE INVENTION

The present invention relates to the field of electronic devices. The invention is illustrated in an example with regard to a hard disk cleaning technique, including a method and apparatus, but it will be recognized that the invention has a wider range of applicability. Merely by way of example, the invention can also be applied to the manufacture of raw wafers, lead frames, medical devices, flat panel displays, microelectronic masks, integrated circuits, and other applications requiring high purity wet processing such as steps of rinsing, cleaning, drying, and the like.

Industry utilizes or has proposed various techniques to rinse and dry hard disks. An example of a conventional technique used to rinse a hard disk is a cascade rinse. The cascade rinse utilizes a cascade rinser, which includes inner and outer chambers, each separated by a partition. Rinse water flows from a water source into the inner chamber. The rinse water from the inner chamber cascades into the outer chamber. An in-process disk is typically rinsed in the cascade rinser by dipping the disk into the rinse water of the inner chamber. This process is often used to neutralize and remove residual material from the disk.

A limitation with the cascade rinser is that "dirty water" often exists in the first chamber. The dirty water typically includes residual material as well as "particles" which often attach to the hard disk. These particles can cause defects in the disk. Another limitation with the cascade rinser is hard disks from the cascade rinser must still undergo a drying operation. Accordingly, the cascade rinse often cannot clean or remove particles from the hard disk.

Another technique often used to rinse hard disks is the "quick dump" method. The quick dump method relies upon the rapid deployment of water from the rinse tank to remove water and impurities from the disk. A limitation with this method is its inability to actually clean or remove particles from the disk. In fact, the rapid deployment of water from the tank often transfers more particles onto the disk. In addition, disks from the quick dump tank must still undergo a drying operation, further increasing the number of particles on the disks and processing complexity.

A further technique used to both rinse and dry disks relies upon a spin rinse/dryer. The spin rinse/dryer uses a combination of rinse water spray to rinse, and centrifugal force to remove water from the disk. The drying step often removes the water from the disk substantially by centrifugal force and evaporation. However, the spin rinse/dryer often introduces more particles onto the disk. In fact, initially dissolved or suspended contaminants such as particles in the water are often left on the disk, thereby reducing the number of "good" disks. Another limitation with the spin rinse/dryer is its complex mechanical design with moving parts and the like. The complex mechanical design often leads to certain problems such as greater downtime, disk breakage, more spare parts, greater costs, among others. A further limitation is static electricity often builds up on the disks during the spin cycle, thereby attracting even more particles onto the surface of the disk. Accordingly, the spin rinse/drying does not clean or remove particles from the hard disk.

Other techniques used to dry hard disks include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the hard disk. An example of such a technique is described in U.S. Pat. No. 4,911,761, and its related applications, in the name of McConnell et al. and assigned to CFM Technologies, Inc. McConnell et al. generally describes the use of a super-heated or saturated drying vapor as a drying fluid. This super-heated or saturated drying vapor often requires the use of large quantities of a hot volatile organic material. The super-heated or saturated drying vapor forms a thick organic vapor layer overlying the rinse water to displace (e.g., plug flow) such rinse water with the drying vapor. The thick organic vapor layer forms an azeotropic mixture with water, which will condense on hard disk surfaces, and will then evaporate to dry the disk.

A limitation with this type of dryer is its use of the large solvent quantity, which is hot, highly flammable, and extremely hazardous to health and the environment. Another limitation with such a dryer is its cost, which is often quite expensive. In fact, this dryer needs a vaporizer and condenser to handle the large quantities of hot volatile organic material. Still further, it has been determined that large quantities of hot volatile organic material are typically incompatible with certain disks.

Still another technique relies upon a hot deionized ("DI") process water to rinse and promote drying of the hard disk. By way of the hot DI water, the liquid on the disk evaporates faster and more efficiently than standard room temperature DI water. However, hot water often produces stains on the disk, and also promotes buildup of bacterial and other particles. Hot water can also damage the disk, thereby reducing the number of good disks produced. Another limitation is hot water is often expensive to heat, and hot DI water is also an aggressive solvent. As an aggressive solvent, it often deteriorates equipment and facilities, thereby increasing maintenance operation costs.

It is clearly desirable to have a cleaning technique, including a method and apparatus, that actually removes particles, prevents additional particles, and does not introduce stains on the hard disks. The cleaning technique should also dry the disks, without other adverse results. A further desirable characteristic includes reducing or possibly eliminating the residual water left on disk surfaces and edges when water is removed (a meniscus). The water left on such surfaces and edges often attracts and introduces more particles onto the disk.

From the above, it is seen that a cleaning method and apparatus for hard disks that is safe, easy, and reliable is often desired.

SUMMARY OF THE INVENTION

The present invention provides a safe, efficient, and economical method and apparatus to clean an article (or object) such as a hard disk. In particular, the present method provides an improved technique that actually removes or reduces the amount of particles from the hard disk and also effectively cleans the substrate. The present method also provides an in situ cleaning system with substantially no mechanical movement of the substrate in some embodiments. Alternatively, the present method uses a plurality of fingers or supports disposed within a center region of the hard disk to move the hard disk into and out of the processing vessel.

One aspect of the present invention provides a method for cleaning a hard disk. The present method includes immersing a hard disk in a liquid comprising water. The hard disk has a front face, a back face, an edge, and a center opening. The method also includes providing a substantially particle free environment (e.g., ultra-clean gas, ultra-clean non-reactive gas) adjacent to the front face and the back face as the disk is being removed from the liquid. A step of introducing a carrier gas comprising a cleaning enhancement substance (e.g., trace amount of polar organic compound, helium, surfactants, carbon dioxide, ammonia, etc.) during the providing step also is included. The cleaning enhancement substance dopes the liquid which is attached to the front face and the back face to cause a concentration gradient of the cleaning enhancement substance in the attached liquid to accelerate fluid flow of the attached liquid off of the disk. Preferably, the disk is supported by a plurality of fingers or supports disposed within the center opening of the disk, but is not limited to this support.

Another aspect of the invention provides an apparatus for cleaning a hard disk. The present apparatus includes a vessel adapted to immerse a hard disk in a liquid comprising water. This hard disk includes a front face, a back face, an edge, and a center opening. The apparatus also includes a first control valve operably coupled to the vessel, and adapted to provide a substantially particle free environment adjacent to the front face and the back face as the hard disk is being removed from the liquid. A second control valve operably coupled to the vessel also is provided. The second control valve is adapted to introduce a carrier gas comprising a cleaning enhancement substance. The cleaning enhancement substance dopes the liquid which is attached to the front face and the back face to cause a concentration gradient of the cleaning enhancement substance in the attached liquid to accelerate fluid flow of the attached liquid off of the disk. The apparatus also includes a plurality of fingers or supports, which can support the disk through the center opening. These supports can move the disk(s) into and out of the vessel in an efficient manner.

A further aspect provides a computer program product for operating a cleaning apparatus. The computer program product includes a computer readable memory having a variety of codes, e.g., software. The memory has a first code that directs a supporting device for holding an object (e.g., disk, wafer) to move in a first direction to immerse the object in a liquid and in a second direction to remove the object from the liquid. The memory also has a second code that directs a first valve to provide a substantially particle free environment adjacent to a face of the object as the object is being removed from the liquid. Furthermore, the memory has a third code that directs a second valve to introduce a cleaning enhancement substance. The cleaning enhancement substance dopes the liquid which is attached to the face to cause a concentration gradient of the cleaning enhancement substance in the attached liquid to accelerate fluid flow of the attached liquid off of the object. The computer readable memory can also have additional codes to perform the operations and methods described throughout the present specification.

A further understanding of the nature and advantages of the present invention may be realized by reference to the latter portions of the specification and attached drawings.

DESCRIPTION OF THE SPECIFIC EMBODIMENT

Figure 1:
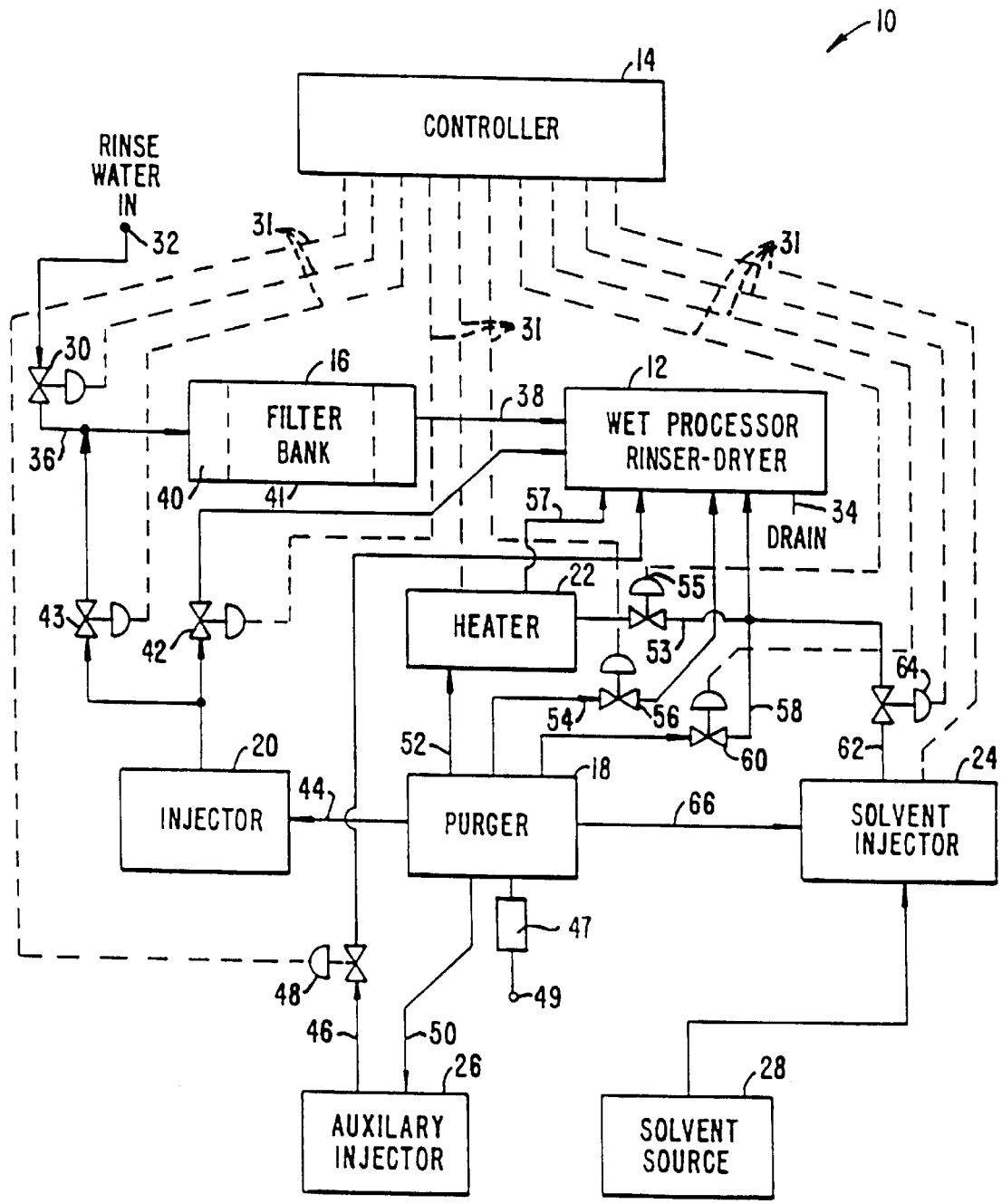
FIG. 1 is a simplified block diagram of an embodiment of the cleaning system according to the present invention.

FIG. 1 illustrates in block diagram form an embodiment of the cleaning system 10 according to the present invention. The cleaning system 10 includes elements such as a wet processor 12, a controller 14, a filter bank 16, a purger 18, an injector 20, a heater 22, a solvent bubbler 24, an auxiliary injector 26, and a solvent source 28. The system also includes a plurality of flow control valves 30. Each of the flow control valves is operably coupled to the controller 14 and at least one of the aforementioned elements, as shown by dashed lines 31. The solid lines represent lines used to transfer fluids between each of the system elements. A rinse water source 32 and drain 34 are also shown.

Rinse water enters the system at the rinse water source 32. A control valve at the rinse water source 32 controls the flow of rinse water via the controller 14, operably coupled to the control valve 30. The rinse water is a filtered liquid such as deionized (DI) water, among others. Typically the DI water originates from a DI water pad, often outside a fabrication plant.

The filter bank can be any suitable combination of filters, typically used for point of use applications. The filter bank connects to the rinse water source through a line 36 and connects to the wet processor through a line 38. The filter bank includes an ion exchange module 40, a combination of charged and neutral filters 41, among others. This filter bank provides point of use ultra-purified water. The ultra-purified water is substantially free from particles greater than about 0.5 microns, and preferably greater than about 0.2 microns, and more preferably greater than about 0.1 microns.

Examples of charged filters are described and illustrated in application Ser. No. 08/285,316, filed Aug. 3, 1994 now U.S. Pat No. 5,542,441, entitled METHOD AND APPARATUS FOR DELIVERING ULTRA-LOW PARTICLE COUNTS IN SEMICONDUCTOR MANUFACTURING (hereinafter "ULTRA-LOW PARTICLE COUNTS") assigned to the present assignee, and hereby incorporated by reference for all purposes. The filter bank provides for ultra-purified DI water with particles no greater than 0.5 microns in diameter, and preferably 0.2 microns in diameter and less and more preferably 0.1 microns in diameter and less.

The filter bank also provides for a nominal pressure drop therethrough. The pressure drop is less than about 15 pounds per square inch, and preferably less than about 5 pounds per square inch.

A higher flow rate is achieved through the filter bank without auxiliary pumps or flow/pressure enhancing devices. Of course, other filters capable of providing ultra-purified water for point of use applications can be used depending upon the application.

The injector 20 can be any suitable injector for reducing or preferably eliminating metal contaminants from lines and system elements. Preferably, the injector 20 is a hydrochloric acid injector. An example of an injector is discussed in ULTRA-LOW PARTICLE COUNTS. The injector connects to the wet processor 12. A control valve 42 meters the acid into the wet processor 12, and a control valve 43 meters the acid into the filter bank 16. Preferably, the controller 14 meters such acid into the system elements such as the wet processor 12 and the filter bank 16, among others during system maintenance, and other desirable times. The injector also connects via line 44 to the purger 18. The purger provides clean pressurized gas to the injector to allow such acid to be introduced into the aforementioned system elements without other auxiliary devices. Of course, the type of injector used depends upon the particular application.

A use of another chemical such as a solvent, hydrogen peroxide, surfactant, cleaning solution, or the like is optionally introduced through the auxiliary injector 26. The auxiliary injector connects to the wet processor through a line 46, and is controlled by a control valve 48 operably coupled to the controller 14. A purger supplying pressurized gas also connects to the auxiliary injector 26 through a line 50. An example of an auxiliary injector and its operation is also illustrated in the ULTRALOW PARTICLE COUNTS. Of course, the type of auxiliary injector used depends upon the particular application.

A further system element is the purger 18, often used to supply gas and/or a pressure head to certain system elements such as the wet processor and others. The purger can be any suitable type of pressure reduction and/or control means capable of supplying the source gas to certain system elements at the desired pressure and flow rate. The purger connects to a source gas 49, which is often a carrier gas used in the cleaning system.

Purger 49 also couples to filter 47 before the gas source. This filter 47 is capable of high flow rates, e.g., 1500 standard liters/minute and greater. Filter 47 also has a retention rating at 0.003 microns. Preferably, no less than about 99.9999999% of particles are removed by way of filter 47. The filter 47 is coupled between the facilities and cleaning system 10. The filter 47 is located before or immediately before the cleaning system 10. In one embodiment, the filter 47 is attached to the cleaning system, but also can be at other locations. This filter provides for a substantially particle free environment. That is, the gas is substantially free from particles greater than about 0.2 microns, or greater than about 0.1 microns, or greater than about 0.05 microns, or greater than about 0.025 microns, or more preferably greater than about 0.01 microns and less. An example of such a filter is product made by Wafergard T-Line Cartridge Filters. Of course, other filters can be used depending upon the application.

Preferably, the carrier gas is an ultra-purified or electronic grade nitrogen gas, or any suitable carrier gas capable of carrying a cleaning enhancement substance (e.g., a trace of polar organic compound, etc.) into the wet processor at a desired temperature, pressure, and flow rate. The suitable carrier gas also includes a high purity level to prevent contamination of the system elements. An example of a purger is illustrated in ULTRA-LOW PARTICLE COUNTS. The carrier gases (or gas) is also ultra-clean or substantially free from particles greater than about 0.1 microns and preferably greater than about 0.05 microns. As previously noted, the purger also supplies pressurized carrier gas to the bubbler 20 and auxiliary injector 26 through lines 44 and 50, respectively. The purger further supplies gas to the wet processor through certain alternative routes.

A typical route connects the purger 18 to the wet processor 12 through the heater 22 via lines 52 and 57. In this route, the gas can be heated at the heater 22 before entering into the wet processor 12 through the line 57. The heater can be any suitable commercially available or custom made heater capable of heating the gas such as nitrogen to a temperature at the wet processor 12 greater than 70° F. and preferably greater than 150° F., but no greater than 200° F. The controller is operably coupled to the heater to adjust the temperature of the gas and turn-on and turn-off the gas at the desired times. Preferably, however, the gas is at room temperature, and is not heated. The controller also meters the gas into the wet processor at a desired flow rate and time.

Alternatively, the heated gas (a carrier gas) connects to the solvent bubbler 24 through a line 53, before entering the wet processor 12. The heated carrier gas mixes and dilutes solvent from the solvent bubbler 24 before entering the wet processor 12. The controller 14 is operably coupled to a control valve 55 to meter the heated carrier gas to the wet processor 12.

Another alternative route connects the purger 18 directly to the wet processor 12 through a line 54. The controller 14 is operably coupled to a control valve 56 to turn-on and turn-off the gas at the desired times. The controller 14 and the control valve 56 also meter the gas into the wet processor 12 at a desired flow rate and time.

In a further alternative route, the purger 18 connects to the solvent bubbler 24 through a line 58 before entering the wet processor 12. In this route, the carrier gas mixes with solvent (a cleaning enhancement substance) from the solvent bubbler 24 before entering the wet processor 12. The controller is operably coupled to a control valve 60 that meters the carrier gas to the wet processor through the line 58. In one embodiment, the carrier gas contains a trace of polar organic solvent. This carrier gas contains a cleaning enhancement substance which increases fluid flow and cleans off objects to be cleaned. Of course, the use of any of these configurations or combinations of such configurations depends upon the particular application.

The controller 14 can be any suitable microprocessor based programmable logic controller, personal computer controller, or the like for process control. A suitable controller includes features such as programmability, reliability, flexibility, and durability from corrosive elements. The suitable controller includes various input/output ports used to provide connections to open and close valves, regulate and meter fluids, among other features. The controller also includes sufficient memory to store process recipes in the form of a computer program for desired applications. An example of a suitable controller is illustrated in ULTRA-LOW PARTICLE COUNTS. Of course, the type of controller used depends upon the particular application.

The solvent bubbler 24 supplies a carrier gas comprising a trace amount of polar organic compound (a cleaning enhancement substance) to the wet processor 12 through line 62. Preferably, the cleaning enhancement substance is a trace of solvent. The purger 18 supplies the carrier gas to the solvent bubbler through line 66. To regulate or meter the flow of the solvent into the wet processor, the controller operably couples a control valve 64 connected to the line 66, attached to the solvent bubbler. The system also provides the solvent source 28 such as a bottle or canister of the desired chemical.

Figure 2:
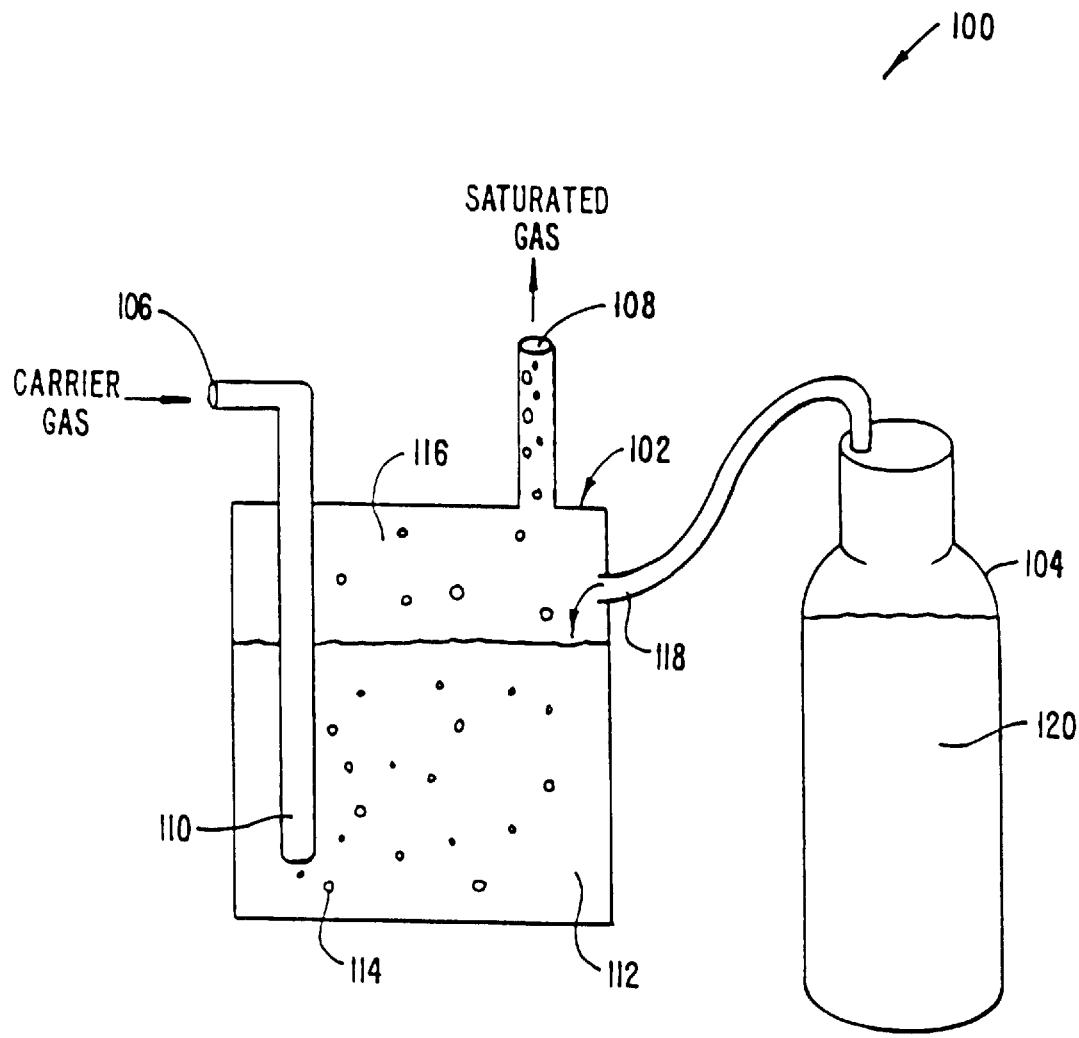
FIG. 2 is a simplified cross-sectional view of a solvent bubbler according to the present invention.

The solvent bubbler can be any suitable solvent bubbler system for use with the wet processor, carrier gas, and solvent. An example of a solvent bubbler system is represented by the simplified illustration of FIG. 2. The solvent bubbler system 100 includes a solvent bubbler vessel 102 and a solvent source 104. The solvent bubbler vessel 102 connects to a carrier gas source at an inlet 106. A sparger 110 sparges carrier gas 114 as bubbles into the solvent 112 at a lower portion of the solvent bubbler vessel. As the carrier gas bubbles float up through the solvent, the carrier gas bubbles accumulate with solvent. Carrier gas bubbles with solvent escape into the vapor head space 116 of the solvent bubbler vessel 102, and exit the solvent bubbler vessel through outlet line 108. This carrier gas with solvent generally behaves according to ideal gas laws or the like. A solvent fill inlet 118 also is connected to the solvent bubbler vessel 102. A solvent source 104 and solvent 120 are further shown. Alternatively, the solvent can be introduced into the carrier gas by mechanical means, e.g., ultrasonic, megasonic, mister, etc.

Figure 3:
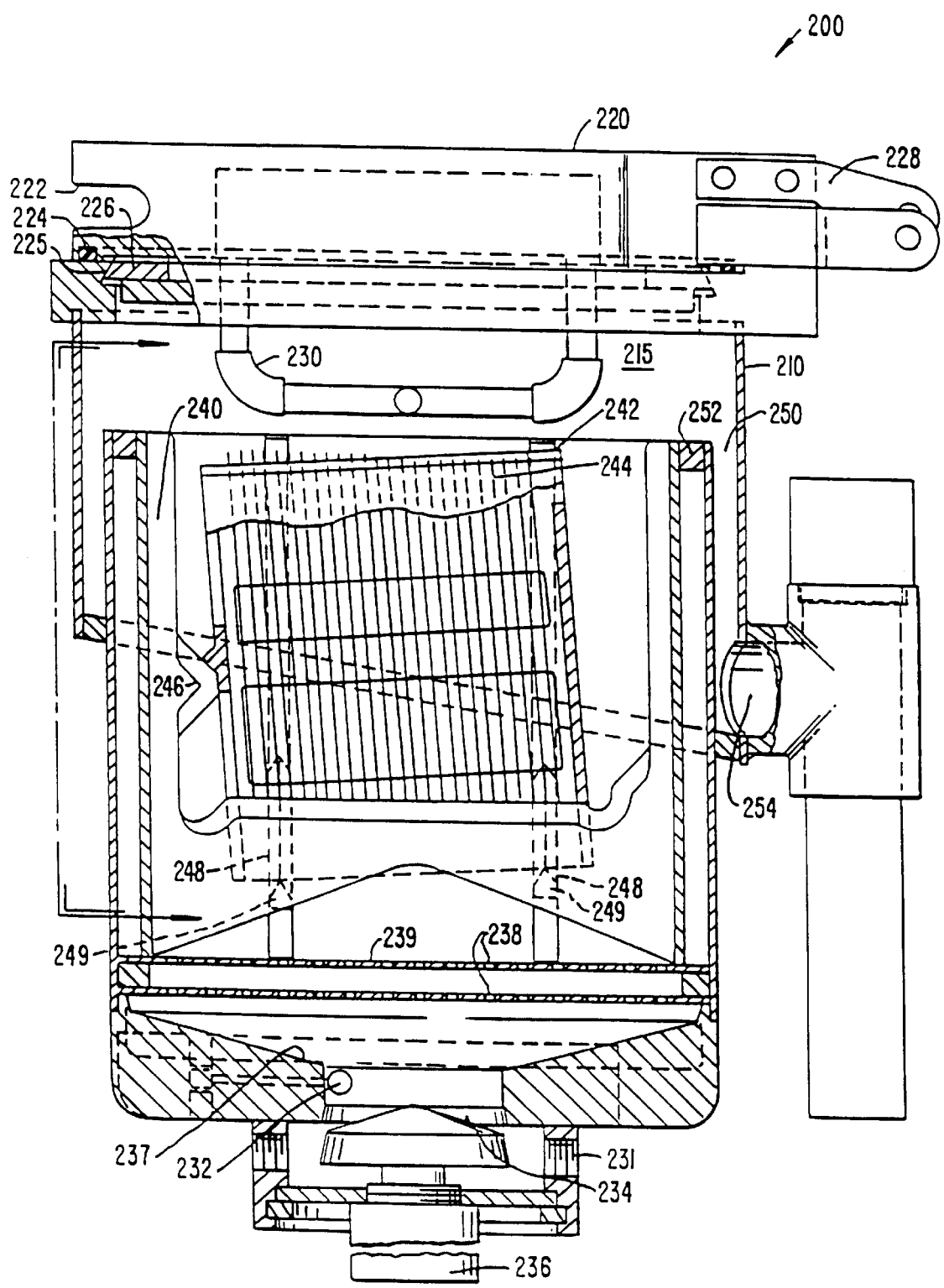
FIG. 3 is a simplified cross-sectional side-view of an embodiment of the cleaning chamber.

FIG. 3 is a simplified cross-sectional side-view 200 embodiment of the cleaning chamber according to the present invention. The side-view embodiment 200 includes a main chamber 210, a lid 220, a lower drain region 231, and other elements. The main chamber 210 includes the process region 240 (or lower chamber region) and upper chamber region 215. A cascade drain region 250 also is shown. Of course, other chamber elements also may be present depending upon the particular application.

The lid 220 is preferably a sealed lid. The sealed lid includes a handle 222, O-ring type seal 224, a compression ring 226, a hinge 228, a gas inlet 230, among other features. The compression ring 226 provides outward force onto a horizontal portion 225 of the main chamber housing to seal the contents of the main chamber. The O-ring type seal 224 provides a horizontal seal between vertical surfaces of the lid and main chamber housing. The gas inlet 230 includes at least a carrier gas inlet and solvent gas inlet. Of course, the exact configuration of the gas inlet depends upon the particular application.

In a specific embodiment, the process region 240 includes a substrate carrier 242, substrate carrier support 246, 248, and substrate support 249. As will be described in some greater detail below, the substrate carrier and substrate support are configured and arranged to minimize liquid accumulation as liquid is drained away in the drying process.

In a specific embodiment, the substrate carrier is a hard disk carrier or alternatively a half carrier or any other type of substrate carrier with a lower profile. The half carrier or lower profile carrier holds or accumulates less liquid than its full carrier counterpart, and therefore drains liquid faster and more easily. The carrier includes substrates (e.g., hard disks) 244 disposed within the supports of the carrier. The carrier is supported by a side substrate carrier support 246 and bottom substrate carrier support 248. The side substrate carrier support holds the substrate carrier in place, and prevents such substrate carrier from excessive movement. As shown, the bottom substrate support tilts the substrate carrier in a slight angle from a horizontal position. The angle tends to prevent substrates from sticking to each other during certain rinse and dry operations. The angle from the horizontal position ranges from about 2° to about 15°, and is preferably determined by the characteristics of the particular carrier. By keeping each of the substrates separated, liquid does not accumulate therebetween, thereby decreasing the amount of liquid and therefore particles from accumulating on the substrate.

Each substrate carrier support includes a contact point on the substrate carrier to drain liquid such as water from the substrate carrier surface. The contact point is typically a knife edge, serrated edge, or any other shape that breaks the surface tension of the liquid on the substrate carrier surface. By breaking the surface tension of the liquid on the substrate carrier, the liquid with particles drains (or "wicks") off of the substrate carrier more easily. Removing the liquid with particles from the substrate carrier tends to promote drying and rinsing of each of the substrates in a particle free manner.

The substrate support 249 provides lift and a contact point to each of the substrates 244 within the substrate carrier. To more easily appreciate the features of the substrate support, it should be noted that each of the substrates in a conventional substrate carrier touches the substrate carrier in at least three large regions. Each of the substrates is also relatively close to the inside surfaces of the substrate carrier. Accordingly, liquid easily accumulates and is often trapped on edges of each of the substrates.

To reduce this effect, the substrate support lifts the substrates in the substrate carrier by elevating each of the substrates in the carrier with a knife edge. By lifting each of the substrates in the substrate carrier, the substrate edges are further away from inside surfaces of the carrier, thereby allowing liquid to flow free from the region between the substrate edges and carrier insides. To further promote the removal of liquid from each of the substrates, the knife edge is preferably pointed, serrated, or any other shape that breaks the surface tension of the liquid at the bottom of each substrate. By breaking the surface tension of liquid at the substrate bottom edges, liquid flows free from the substrate bottom edges, thereby reducing the meniscus at such edges. The knife edge lifts each of the substrates at least 2 mm from the bottom insides of the carrier, and preferably lifts each of the substrates about 5 mm, but no more than about 20 mm. The substrate carrier support removes liquid such as water from the substrates, thereby decreasing the amount of water and in particular the particles in the water.

To add and drain liquid into the main chamber, and in particular the process region, the lower drain region 231 includes a fill inlet 232 and drain valve 236. The fill inlet provides liquid such as DI water and the like into the process region. The drain valve 236 removes liquid from the process region through the drain outlet 236. A plurality of drain holes 238 also exist at the bottom of the main chamber in the process region to distribute the liquid evenly therethrough. The lower drain region also includes an angled drain floor 237 at the bottom of the main chamber to facilitate liquid transfer, and a flat support surface 239 in the process region to support the substrate carrier support.

A cascade region 250 allows liquid to cascade out into cascade drain region 253. To rinse certain chemicals from the substrate carrier and substrates, ultra-purified DI water enters through the fill inlet 237, rises through the drain holes 238, flows through the process region 240, and cascades over a partition 252 into the cascade drain region 253. This sequence of steps removes excess chemicals such as acids or the like from the substrate carrier and substrates, and also keeps such chemicals from accumulating in the main chamber and in particular the process region.

Figure 4:
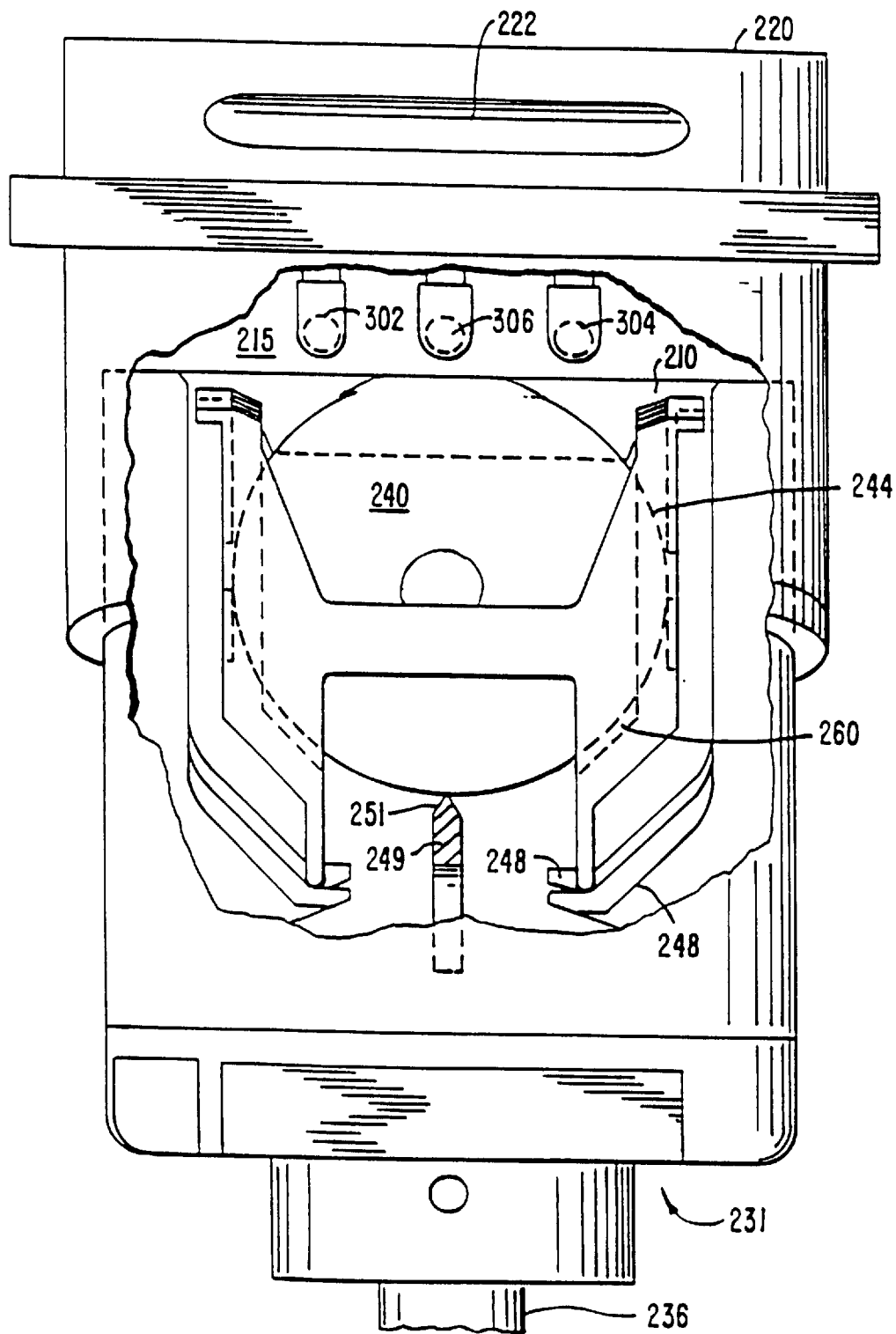
FIG. 4 is a simplified cross-sectional front-view of an embodiment of the cleaning chamber.

FIG. 4 illustrates a simplified front view of the cleaning chamber according to the present invention. For easy reading, FIG. 4 uses some of the same reference numerals as the FIG. 3 embodiment. The front-view embodiment shows elements such as the main chamber 210, the lid 220, the lower drain region 231, the process region 240, among others. The main chamber 210 includes the process region 240 and upper chamber region 215.

As shown, the substrate support 249 lifts each of the substrates from the substrate carrier to form a gap 260 between substrate edges and substrate carrier insides. The gap prevents liquid from accumulating between such substrate edges and substrate carrier insides. The gap is no greater than about 20 mm, but is larger than about 2 mm. The substrate support is a knife edge with triangular point 251. Other shapes may also be used to break the meniscus at the bottom of the substrate edges and remove water therefrom. The meniscus often forms at the bottom substrate and surface edges as liquid is being removed from the substrates. As previously noted, the meniscus often contains particles, often detrimental to the manufacture of an integrated circuit.

The front view also shows the substrate carrier supports 248. As shown, each of the substrate carrier support is arranged with different heights, typically lower to higher from one side of the process region to the other side of the process region. The different heights of the substrate carrier support tilt the position of the substrate carrier from horizontal. The tilt or angle of the substrate carrier also tilts the substrates, thereby preventing such substrates from sticking to each other during certain rinse and dry operations.

The front view further shows certain gas inlets 302, 304, and 306. Each of the gas inlets is a distribution plenum with a plurality of holes for distributing gas evenly over the process region. The embodiment includes two outside gas inlets 302 and 304, and a center carrier gas inlet 306. The two outside gas 302, 304 inlets generally introduce an ultra-pure non-reactive (e.g., non-oxidizing, non-reactive, inert, etc.) gas into the cleaning chamber. In some embodiments, the two outside gas inlets provide ultra-pure nitrogen to purge the main chamber from the environment, thereby creating an ultra-clean main process region, e.g., substantially free from particles. In these embodiments, the nitrogen gas (or absence of oxygen gas) is necessary or even critical to prevent the formation of oxidation on the substrate, e.g., hard disk. The center gas inlet introduces the carrier gas comprising the cleaning enhancement substance. The non-reactive gas (or nitrogen) mixes with the carrier gas comprising cleaning enhancement substance in the cleaning chamber. By way of the ultra-pure non-reactive gas and carrier gas, the chamber is substantially free from particles greater than about 0.2 microns, and is preferably substantially free from particles greater than about 0.1 microns, thereby creating an ultra-pure and ultra-clean environment. Of course, the number of inlets and their use depend upon the particular application.

Figure 5:
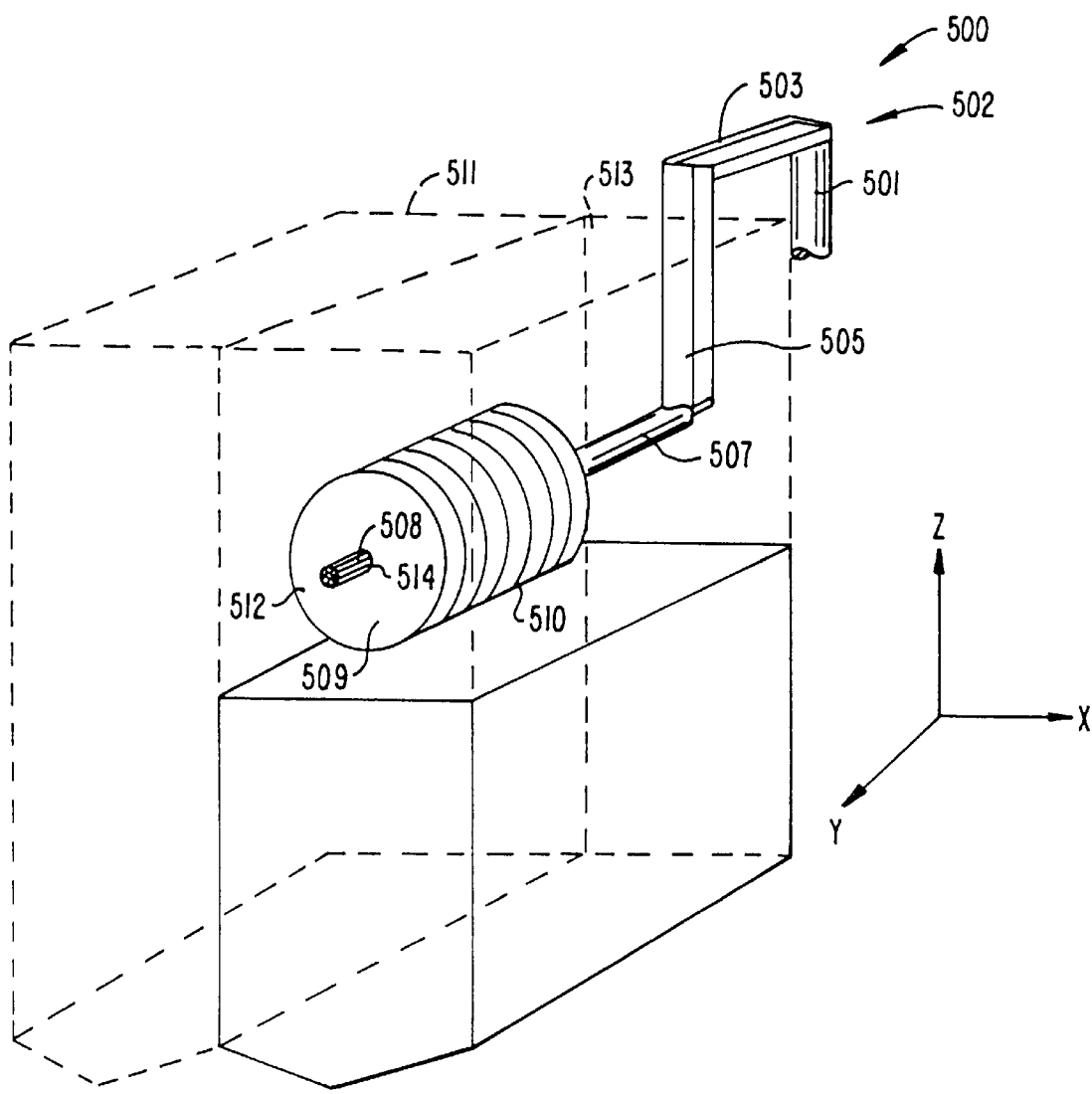
FIG. 5 is a simplified diagram of an alternative embodiment of the cleaning chamber.

FIG. 5 is a simplified diagram of an alternative embodiment of the present cleaning apparatus 500 according to the present invention. This diagram is merely an illustration and should not limit the scope of the claims herein. One of ordinary skill in the art would recognize other variations, alternatives, and modifications. The present embodiment is specifically tailored for a substrate having an opening in a center region such as a hard disk used for memory applications or the like. For referencing, a coordinate system (i.e., x, y, z) is defined on the lower corner of the Fig.

As shown, apparatus 500 includes various elements including a handing device 502, and a plurality of vessels 511, 513, which can clean and/or dry substrates, as well as perform other processes. In this embodiment, the substrates are a plurality of hard disks 510, each having an opening 514 in a center region 508. Support beam or mandrel 507 supports the hard disks by way of the center region, which eliminates any possible stress on edges 512 of the hard disks. By way of eliminating or substantially reducing stress on edges 512, the hard disks can be processed in a more friendly environment, which is less prone to mechanical or physical damage of the hard disks. As shown, mandrel 507 has a portion 508, which protrudes out of the center region 514 (i.e., opening) in the last hard disk 509.

Figure 6:
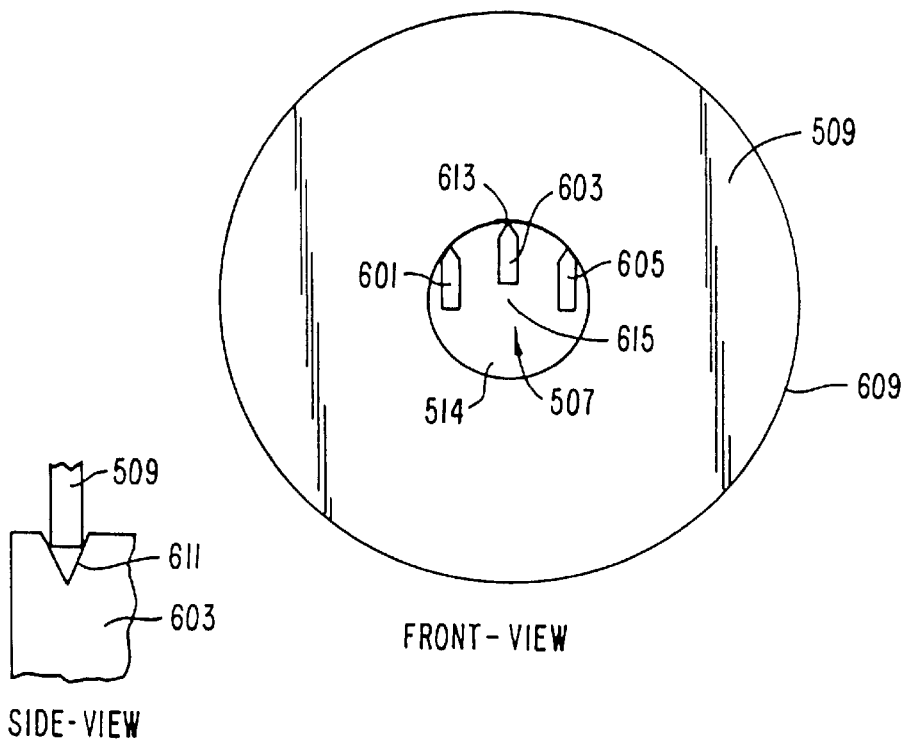
FIGS. 6–9 are detailed diagrams of various views of disk support devices according to the present invention.
Figure 7:
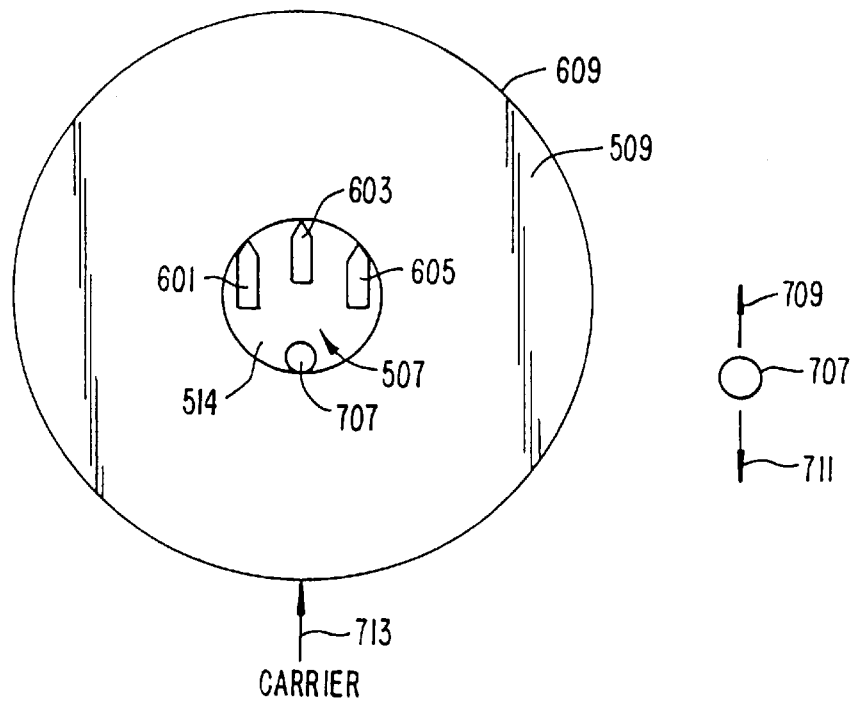

Handing device 502 also includes various structural elements such as a vertical member 501, which couples to a horizontal member 503, which couples to another vertical member 505. Vertical member 505 is attached to support beam or device or mandrel 507, which is further described structurally and functionally by way of FIGS. 6 and 7. FIGS. 6 and 7 are simplified front-view diagrams of alternative embodiments of the mandrel 507 according to the present invention. These Figs. are merely illustrations and should not limit the scope of the claims herein. One of ordinary skill in the art would recognize other variations, modifications, and alternatives. For cross-referencing, some of the same reference numerals as described above are used in these Figs. As shown is the front-view of the hard disk 509, including the center region 514 and the mandrel 507. The mandrel includes at least three fingers or structures 601, 603, and 605 to support and provide lift to the hard disk. Finger 603 includes a knife edge 613, which comes in contact with an upper top portion of the center region 514 to provide mechanical support to the hard disk. The knife edge can be serrated, flat, or sharp to draw any fluid away from the hard disk.

Finger 603 also includes a bevelled region 611, which engages disk 509 into the finger 603, as shown in the side-view diagram. Additionally bevelled region 611 mechanically holds disk 509, and prevents slippage of the disk along the mandrel during processing or movement of the mandrel. Additional fingers 601 and 605 prevent regional disk movement in x-y-z directions (e.g., swinging disk) and also provide mechanical support to the disk during global disk movement by way of the handing device. Similar to finger 613, fingers 601 and 605 each include a knife edge and also include a bevelled region, which mechanically holds the disk in place. As shown, fingers 601 and 605 each include a contact point or a knife edge placed near an upper region above the center point 615 of the center region, but are each laterally disposed evenly from each other to form a "tripod-type" structure.

By supporting the disk in the center region, mechanical stress is substantially reduced or even eliminated at an edge 609 of the disk, which tends to prevent a possibility of damage to the disk. In particular, the center region of a common disk is often thicker and has greater mechanical stability and support than edges of the disk, which tend to be more fragile. The center is designed to have greater mechanical support since a drive motor often rotates the disk by the center region in the actual application. Additionally, most of the working or active memory storage region of the disk is at edge regions and not in the center region. Accordingly, the present handing device provides an improved distribution of mechanical stress to the disk, as compared with conventional techniques, which often support the disk at edges using carrier devices.

FIG. 7 is a simplified diagram of an alternative embodiment according to the present invention. This diagram is merely an illustration and should not limit the scope of the claims herein. Like reference numerals are used in FIG. 7 as the previous Fig., for example. As shown is the front-view of the hard disk 509, including the center region 514 and the mandrel 507. The mandrel includes the three fingers or structures 601, 603, and 605 to support the hard disk. Finger 603 includes the knife edge 613, which comes in contact with an upper top portion of the center region 514 to provide mechanical support to the hard disk. Finger 603 also includes bevelled region 611, which engages disk 509 into the finger 603, as previously noted. Additionally, bevelled region 611 mechanically holds disk 509 or prevents slippage of the disk along the mandrel during processing or movement of the mandrel. Additional fingers 601 and 605 prevent regional disk movement in x-y-z directions (e.g., swinging disk) and also provide mechanical support to the disk during global disk movement by way of the handing device. Similar to finger 613, fingers 601 and 605 each include the knife edge and also include the bevelled region, which mechanically holds the disk in place. As shown, fingers 601 and 605 each include the knife edge placed near the upper region of the exact center point of the center region, but are each evenly laterally disposed from each other to form the "tripod-type" structure.

To further prevent any movement of the disk or disk "swinging," a lower support finger 707 is coupled to the mandrel. This lower support should be shaped in a manner to be removable from the center region. That is, finger 707 is cylindrical or rod shaped to be insertable into the center region 505. Finger 707 preferably does not includes a bevelled region and is preferably smooth. Finger 707 also moves in the positive z-direction 709 and the negative z-direction 711, which helps to remove the mandrel 507 from the center region to unload the disk. In a specific embodiment, as the hard disk is placed into a carrier for unloading, force 713 is applied to a bottom portion of the hard disk to push the disk out of the bevelled regions in fingers 601, 603, and 605. Finger 707 retracts in the positive z-direction (as shown by reference numeral 709), and the mandrel is moved in the negative y-direction to remove the mandrel out from the center region, which unloads the hard disk(s) from the mandrel or handing device.

The fingers on the mandrel also draw fluid away from the disk using a wicking action during a cleaning or drying process. Each of the fingers draw fluid or liquid away from the disk by breaking the surface tension of the fluid or liquid attached to the disk. Typically, the fluid or liquid accumulates along edges of the inner and outer disk periphery. The fingers are located in a spatial manner surrounding the inner periphery of the disk to draw fluid evenly from the disk. Preferably, the fingers are spaced apart from each other at a relatively equal distance. To enhance support of the disk and to enhance drawing fluid away from the disk, the bevelled region includes two sloped regions, which have an angle defined therebetween. The angle ranges from about 85 to about 150°, and is preferably about 90 to about 120°. The angle is specifically selected to enhance mechanical support and to enhance fluid movement or flow away from the disk, thereby enhancing drying. In most embodiments, drawing fluid away from the disk using the fingers also draws any particulate contamination in the fluid away from the disk.

The fingers on the mandrel can be made of any suitable material, which is rigid enough to support and move the plurality of hard disks. Additionally, the surface of the fingers is preferably hydrophilic to draw water away from the disk using a "wicking" action. The surface can be made of metal such as stainless steel, steel alloys, or others. The surface also can be made of plastics, glass, quartz, or the like. The material needs to have sufficient strength for durability, chemical resistance, and structural integrity. An example of such a material is called polymer polyethylethylketon, commonly termed PEEK, which is made by, for example, Capital HPLC Limited, but is not limited this manufacturer. Of course, the type of material used and its surface depend upon the application.

Handing device or more particularly vertical member 501 is coupled to a drive motor and drive means, e.g., gears, belts, to move the handing device in three-dimensions, i.e., x, y, z. These dimensions are shown in the lower right hand corner of the Fig. for reading convenience. In a specific embodiment, handing device moves the hard disks in a spatial manner through one of numerous vessels including a load/unload station. For example, the handing device moves in the z-direction in a constant, stepped, or accelerated manner. In the constant manner, the handing device moves in the z-direction at a constant speed. The speed also can be stepped from a lower speed to a higher speed, but is not limited to any one of these speeds. The handing device can also accelerate. In the y-direction and/or x-direction, the handing device can move from vessel to vessel or vessel to load/unload station or the like. As merely an example, the movement in either the y-direction or x-direction occurs at a constant, a stepped, or an accelerated manner.

Vessels 511 and 513 can be similar to those previously noted, except for the difference in substrate handing. That is, the vessels can include a variety of processing features such as a purger, a drain, a filter bank, a place for hard disk supports or carrier supports, a controller, an injector, a heater, a solvent bubbler, an auxiliary injector, and a solvent source. The system also includes a plurality of flow control valves. The controller oversees and directs handing device movement, which is noted above. The controller is programmable with a computer program with specific recipes to process hard disks using a variety of processing conditions for specific applications.

Figure 8:
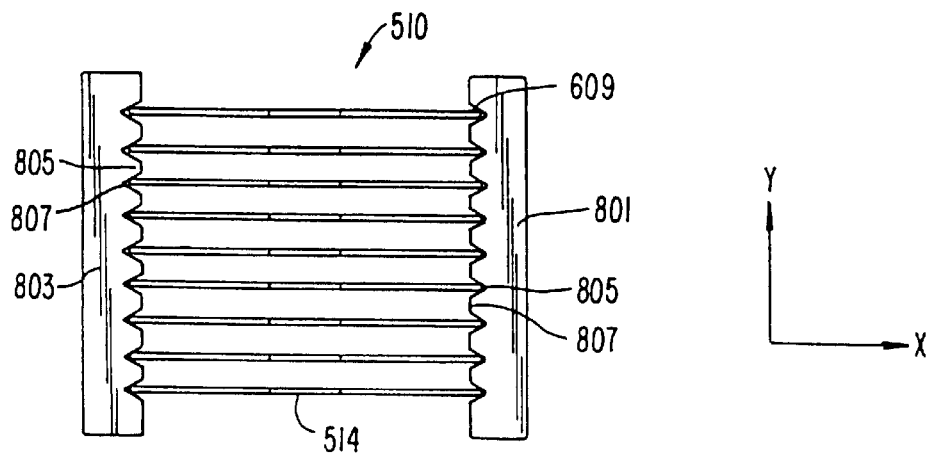
Figure 9:
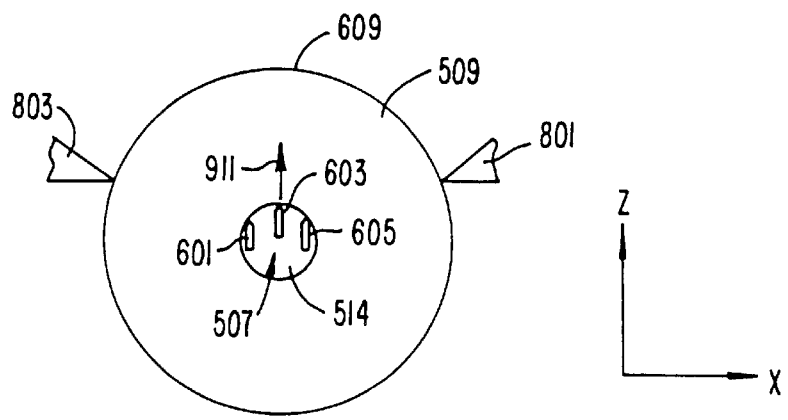
Figure 9:
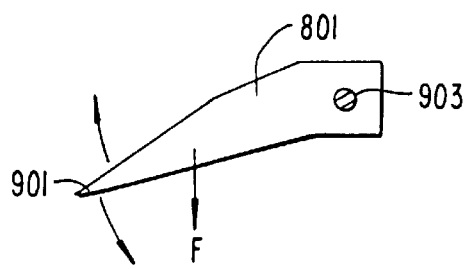

FIGS. 8 and 9 are simplified diagrams of further embodiments of knife edges according to the present invention. These diagrams are merely illustrations and should not limit the scope of the claims herein. One of ordinary skill in the art would recognize other modifications, alternatives, and variations. These Figs. use similar reference numerals as noted above for cross-reading, for example. Referring to FIG. 8, for example, fluid is wicked away or drawn away from the outer edge 609 of wet disks using moveable or rotatable knife edges 801, 803, which are each configured as a "comb." Each knife edge is moveable in the z-direction and includes a plurality of "teeth," including a plurality of recessed regions 805 and a plurality of protruding regions 807. Each of the recessed regions is coupled to outer edge 609 of the disk. As shown are the plurality of hard disks 510.

FIG. 9 is a simplified front-view diagram of a disk and knife edges according to the present invention. The diagram includes the disk 509, the mandrel 514, with the fingers 601, 603, and 605, as noted previously. To move the disk(s) 509 out of a vessel in a vertical manner (i.e., positive z-direction), the mandrel 507 moves the disk in the positive z-direction, as shown by reference numeral 911. As the disk moves in the positive z-direction, the disk edge 609 contacts and passes through the recessed region 805 of the comb. The comb draws fluid away from the edge of the disk or "wicks" fluid away from the edge of the disk. Comb 801 is movable or pivotable about a fixed axis 903 in some embodiments. As shown, comb 801 includes a tip or contact region 901, which moves in the z-direction, e.g., positive and negative, with rotational movement. Accordingly, comb 801 can move along a certain tangential length across the edge of the disk. Preferably, the tangential length is greater than about ⅛ the circumference of the disk. Or more preferably, the tangential length is greater than about ¼ the circumference of the disk. In some embodiments, comb 801 can move directly up and down about axis 903 in the z-direction. Additionally, comb 801 can move in the x-direction to keep in contact with the disk edge. Of course, the exact movement of the comb depends upon the application, but will be selectively adjusted to enhance fluid flow off of the disk edge.

Although the above description is described in terms of directly processing the disks by way of a mandrel, the handing device can also be used with a carrier. For example, the carrier can be held using the handing device without a mandrel, and have movement in the x-y-z directions. The carrier can hold the hard drives as well as other substrates. For example, the carrier can even be a wafer boat or half boat to move a plurality of wafers in and out of the processing vessels according to the present invention. Of course, the type of carrier device used depends highly upon the application.

Figure 10:
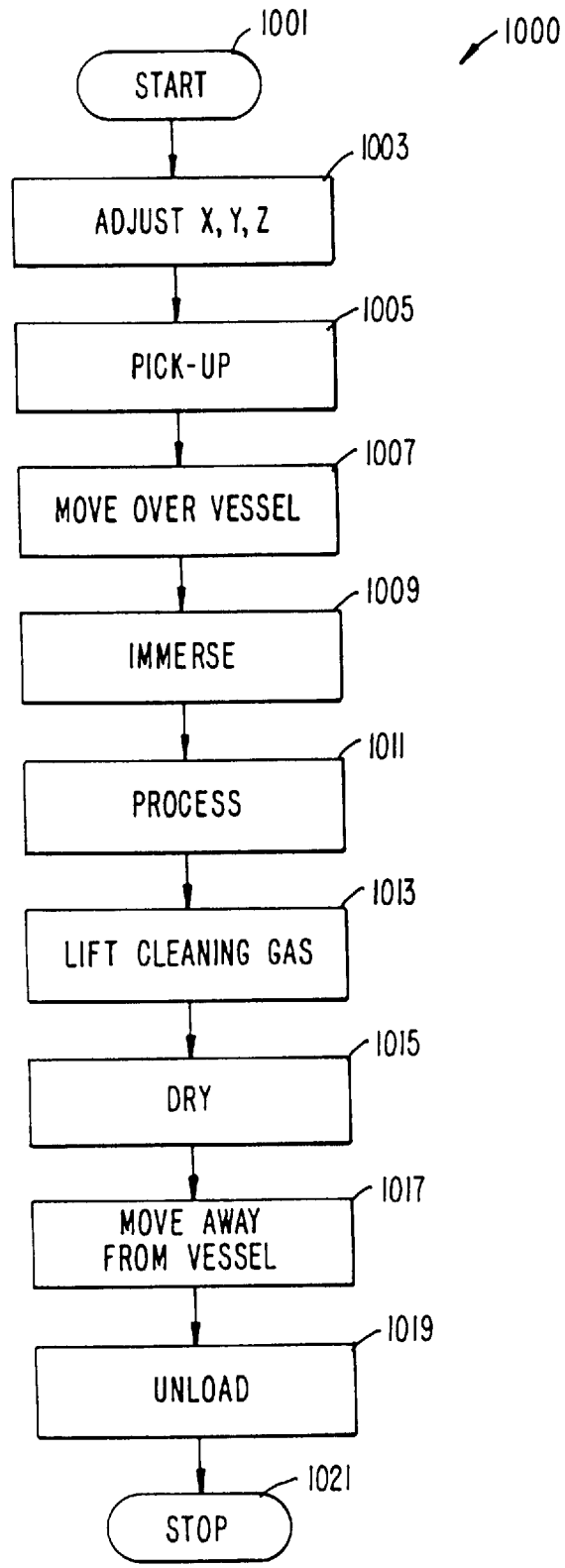
FIG. 10 is a simplified flow diagram of an embodiment of a cleaning method according to the present invention.

FIG. 10 is a simplified flow diagram 1000 of an embodiment of a cleaning method according to the present invention. The cleaning method includes cleaning and drying, which is illustrated using a disk for memory applications. This flow diagram, however, is merely an example and should not limit the scope of the claims herein. One of ordinary skill in the art would recognize other modifications, alternatives, and variations. Additionally, this method can be carried out by way of the aforementioned systems, but is not limited to these systems.

The flow diagram 1000 starts at reference numeral 1001, for example. A handing device adjusts (step 1003) its location in the x-y-z directions to position itself for loading or picking up a plurality of substrates, which can be in a carrier. In particular, the handing device determines its location and then moves to the desired location, which is the load/unload station for the substrates.

Using step 1005, the handing device picks up the plurality of substrates using a mandrel or other supporting device and lifting the substrates in the positive z-direction. The handing device moves the substrates in an x and/or y direction to a processing vessel, step 1007. In this example, the processing vessel is filled with ultraclean fluid such as ultra-purified deionized water to remove any residual material or particles from the substrates. The handing device moves the mandrel in the negative z-direction to immerse the substrates in a bath of fluid, as shown in step 1009.

After immersing the substrates, the handing device allows the substrates to undergo processing, which can include additional movement of the substrates, if desired. In a specific embodiment to remove particles or residual material from the surface of the substrate, the ultra-purified DI water in the main chamber (or vessel) flows across the substrate and cascades over into a drain. The DI water cascade carries particles or residual material into the drain. Optionally, the DI water in the vessel may be removed by dumping it into a bottom drain dump. In some embodiments, the dumping step is a partial dump, and not a complete dump or removal of DI water. During the removal of the DI water, an ultra-pure gas (non-reactive) replaces the DI water. A typical gas includes filtered nitrogen and others. The filtered gas also is ultra-clean, e.g., substantially free from particles. After replacing the DI water with the clean gas, clean DI water from the DI water source flows into the main chamber to cover the surface area of the substrate. These steps can be repeated along or in combination with others until substantially no residual material is left on the substrate.

When the residual material has been substantially removed from the substrate, a carrier gas, including a cleaning enhancement substance (e.g., trace amount of polar organic compound, helium, carbon dioxide, etc.), is introduced into the vessel, and mixes with ultra-pure non-reactive gas. In one embodiment, the trace of polar organic compound in the gases includes a concentration ranging from about 1,000 ppm and less to about 500 ppm and less. The polar organic compound also can be at other concentrations, but is generally not saturated or superheated. The carrier gas is preferably ultra-pure nitrogen with a trace of polar organic compound such as isopropyl alcohol, di-acetone alcohol, 1-methoxy-2-propanol, and others. The carrier gas is also substantially free from particles of about 0.20 microns to about 0.15 microns, and is preferably free from particles of about 0.10 microns or less. For a typical batch of substrates in a conventional carrier, the amount of polar organic compound used is preferably less than a milliliter.

The trace of polar organic compound is made by bubbling carrier gas into a liquid solution of polar organic compound. In particular, the polar organic compound is made by flowing cold or hot nitrogen through a solution of polar organic compound at a rate of about 3 cubic feet/min. or less. The carrier gas comprising the polar organic compound then mixes with either cold nitrogen at a flow rate of about 5 cubic feet/min. and less, or hot nitrogen at a flow rate of about 10 cubic feet/min. and less. A temperature of such hot nitrogen carrier gas is at about 70° F. and higher but not greater than 250° F., and is preferably about 185° F. and less. By mixing nitrogen gas with the carrier gas comprising the polar organic compound, the polar organic compound is substantially dilute (or a non-saturated vapor) in the main chamber.

The mixed carrier gas, including the polar organic compound and nonreactive gas, comes in contact with the attached DI water on the disk, which is being drained off at a slow rate as the handing device moves or lifts the substrates out of the vessel, as shown in step 1013. This tends to also remove particles from such substrate. A carrier gas, including isopropyl alcohol, 1-methoxy-2-propanol, di-acetone alcohol, or other polar organic solvents mixed with non-reactive gas, replaces contact with the DI water at a rate of about 4 mm/second or less as measured from the substrate face, and is preferably at a rate of about 1 mm/second and less, as the substrates are lifted out of the bath of fluid.

The trace of polar organic compound is believed to remove a substantial portion of the liquid on the substrate surface through a concentration gradient or mass transfer effect, e.g., Marongoni flow. This effect tends to increase the flow of liquid from the substrate surface through use of a solvent or any cleaning enhancement substance, but does not remove all liquid from the substrate surface. It is generally believed that the trace of polar organic compound in the gas changes the angle of the liquid meniscus on the substrate face to reduce surface tension of the liquid attached to the substrate face, thereby increasing fluid flow therefrom. It is also generally believed that the trace amount of the polar organic compound dopes the liquid attached to the substrate face to cause a concentration gradient of the polar organic compound in the attached liquid to accelerate fluid flow of the attached liquid off of the substrate face. In particular, the polar organic compound forms a concentration gradient along a boundary layer of liquid attached to the substrate surface, which facilitates the fluid flow therefrom. This fluid flow pulls or draws off any particles from the substrate face. These particles are less than about 0.5 microns in diameter or preferably 0.2 microns in diameter or more preferably 0.1 microns in diameter. Preferably, the carrier gas also is not heated but is at room temperature, e.g., 18 to 22.5 ° C.

In certain embodiments, a thin boundary layer of liquid still remains on the substrate face after the immersed substrate is removed from the bath of fluid. This boundary layer often ranges from about 1,000 Å and less and is preferably 500 to about 50 Å, and is more preferably at about 100 Å and less. In one embodiment using isopropyl alcohol as the polar organic compound, the boundary layer is about 500 Å and less. In an embodiment using 1-methoxy-2-propanol, the boundary layer is about 100 Å and less. A further drying step can be used to evaporate such boundary layer after the substrates are removed from the bath of fluid.

In alternative embodiments, the gas (i.e., ultra-pure gas) is substantially free from any polar organic compounds, organic compounds, or the like. Like the previous embodiments, the gas comes in contact with the substrate as the substrate is removed from the DI water bath, which also tends remove particles from such substrate via the DI water. The substrate is moved from the DI water bath at a rate of about 2.50 mm/second or less as measured from the substrate face, and is preferably at a rate of about 1.25 mm/second and less, and is more preferably at a rate of about 0.60 mm/second or less. In such embodiments, the present invention uses substantially no harmful solvents or the like, and is therefore even more safe, efficient, and economical.

A step of drying (step 1015) is performed on the substrates (and possibly a carrier) for further drying, if desired. The step of drying substantially removes all liquid droplets adhering to surfaces such as substrate edges, carrier edges, and the like. In one embodiment, drying occurs by pulse flow drying. The step of pulse flow drying occurs by way of high velocity flow apparatus, which is described in application Ser. No. 08/555,634 in the name of Mohindra et al., and common assigned. Each nozzle can be positioned to direct drying fluid to the substrate edges and portions of the substrate surface, but is not limited to this position. The nozzle is directed to an inner edge of the substrate carrier, if used, to promote the removal of liquid between the substrate edges and the carrier sides. The nozzle is defined between about 0.5 inch to about 2 inches from an outside edge of the substrate carrier. The nozzle is placed at an angle from about 5° to about 85°, and is preferably about 45° from a line perpendicular from the substrate surface. Of course, the exact angle used depends upon the particular application.

In some embodiments, drying occurs by directing drying fluid from the first nozzle set and the second nozzle set in an alternating sequence against the substrate edges and portions of the substrate surfaces. For example, the first nozzle set sends a pulse of drying fluid against the substrate edges and portions of the front substrate surfaces, then the second nozzle set sends a pulse of drying fluid from the opposite direction against the substrate edges and portions of the back substrate surface. The drying fluid pulses from the first nozzle set and the second nozzle set alternate until no more liquid remains on the substrate edges.

In removing water from the substrate edges, the second nozzle set has a pulse duration which is longer than the pulse duration of the first nozzle set. Water adheres on the backside of the substrate and substrate edges of a disk with a greater attractive force than the front-side of the substrate. Accordingly, it is often preferable to have a pulse duration at the second nozzle set which is at least two times longer than the pulse duration at the first nozzle set. The pulse duration at the second nozzle set can also be three times longer or more than the pulse duration at the first nozzle set.

The pulse duration for the first nozzle set ranges from about 1 to 3 seconds and greater, and the pulse duration for the second nozzle set ranges from about 2 to 6 seconds and greater. The number of pulses is preferably greater than 5 for each substrate side for a total of about 30 seconds of total pulsing time. Of course, other selected pulses among the first and second nozzle sets may also be performed, depending upon the particular application.

Optionally, pulse flow drying is followed or replaced by flowing hot nitrogen gas over the substrate, and carrier, if used. The hot nitrogen gas is ultra-pure nitrogen gas with a temperature at about 70° F. and is preferably greater than 150° F., but no greater than 200° F. The combination of hot nitrogen and pulse flow drying reduces actual drying time by about one half, as compared to drying solely by means of hot nitrogen and the like. Alternatively, a drying gas such as nitrogen can be used alone to dry the substrate. Alternatively, hot nitrogen gas alone can be used to dry the substrate. Of course, other carrier gases and combinations thereof may also be used depending upon the particular application.

In an alternative embodiments, the present technique uses a gas or fluid without any polar organic compound or the like to clean and dry the substrate as the substrate is being removed from the DI water. In such embodiments, the handing device moves the substrate at a rate of about 2.50 mm/second or less as measured from the substrate face, and preferably at a rate of about 1.25 mm/second and less, and more preferably at a rate of about 0.80 mm/second or less, as the substrate is removed from the DI water. The gas without any polar organic compounds or the like may also be nitrogen at a temperature ranging from about 70° F. to about 250° F. To further dry the substrate and carrier, warm or hot nitrogen is pulsed or introduced into the vessel. The nitrogen can be at a temperature ranging from about 70° F. to about 250° F.

After the substrates are clean and dry, the handing devices moves the substrates away (step 1017) from the vessel to a load/unload station (1019) or another processing vessel, if desired. In particular, the handing device uses its drive means to move the substrates in a combination of directions (e.g., x-direction, y-direction, and z-direction) to physically move the substrates. After processing the substrates by way of this method, the substrates are placed at a load/unload station for unloading purposes. The flow diagram stops at step 1021, but the aforementioned steps can be repeated numerous times for other substrates.

The above sequence of steps can be performed by way of a computer program having software, e.g., codes. For example, the controller can be programmed using a computer program or software, e.g., recipe. The computer program, which is stored in memory (e.g., hard drive, memory chips, floppy disk), can be retrieved in a temporary buffer that carries out the above steps. Alternatively, the controller can be programmed to perform variations to the above steps, as well as others. Accordingly, the present system includes a computer program according to certain embodiments.

The aforementioned method also includes the use of a certain substrate support and a substrate carrier support to enhance wicking or to draw liquid away from the substrate, and carrier, if used. For example, the substrate support includes a knife edge that lifts the substrates to prevent accumulation of water at the substrate edges, and in particular the substrate top edges. The substrate carrier support wicks or draws the water from the surface of the substrate carrier, if used, and also puts a slight tilt from horizontal on such carrier.

The slight tilt of the substrate carrier also tilts the substrates, which tends to prevent them from sticking to each other. As previously noted, sticking substrates often accumulate water therebetween. The accumulation of water also accumulates particles, which may be in the water. By removing the water and particles from the substrate, the present method provides higher device yields on a typical substrate.

In some embodiments, the present cleaning method occurs without movement of the substrate. In fact, the substrate, and carrier, if used, remains substantially stationary after being immersed, and during the drying, cascade rinse, and other steps. By way of less movement, the system has fewer mechanical parts and is often easier to use and maintain than certain prior art systems. Additionally, the lack of movement prevents a possibility of any mechanical damage to the substrate while processing.

Alternatively, the aforementioned cleaning method can be performed using a substrate support through a center region of the substrate such as a hard disk. The substrate support moves the substrate into and out of the cleaning vessel without placing undue stress on outer regions of the hard disk, for example.

Moreover, the amount of polar organic compound used for each batch of substrates is typically less than a fraction of a milliliter. The use of less organic compounds is often advantageous to the highly flammable prior art methods of drying a substrate by way of IPA for example. In certain embodiments, no polar organic compounds or the like are used. Accordingly, the present method is less hazardous than certain prior art methods to both health and environment.

While the above is a full description of the specific embodiments, various modifications, alternative constructions, and equivalents may be used. For example, while the description above is in terms of a method and apparatus for hard disk substrates, it would be possible to implement the present invention to the manufacture of raw wafers, partially completed wafers, flat panel displays, microelectronic masks, and other applications requiring high purity wet processing such as steps of rinsing, drying, cleaning, and the like. In addition, the systems of the Figs. are in terms of a cleaning system for hard disks. A skilled artisan may, alteratively, employ such systems to other industries such as electrochemical, pharmaceutical, printed circuit board, optical devices, and any other industry that needs an improved technique to rinse and dry an article of manufacture.

Therefore, the above description and illustrations should not be taken as limiting the scope of the present invention which is defined by the appended claims.

What is claimed is:

1. A method for cleaning a memory disk comprising:
   supporting a center region of a disk using a mandrel;
   immersing said disk in a liquid comprising water, said disk including a front face, a back face, and an edge;
   providing a substantially particle free environment adjacent to said front face and said back face as said disk is being removed from said liquid; and
   introducing a cleaning enhancement substance during said providing step, said cleaning enhancement substance doping said liquid which is attached to said front face and said back face to cause a concentration gradient of said cleaning enhancement substance in said attached liquid to accelerate fluid flow of said attached liquid off of said disk.

2. The method of claim 1 further comprising introducing a drying source adjacent to said disk, said drying source removing said liquid attached to said edge.

3. The method of claim 1 wherein said providing leaves a thin boundary layer of said liquid attached to said front face and said back face.

4. The method of claim 3 wherein said boundary layer is about 1,000 Å and less.

5. The method of claim 3 wherein said boundary layer is about 100 Å and less.

6. The method of claim 1 wherein said cleaning enhancement substance is selected from a group consisting of a surfactant, isopropyl alcohol, di-acetone alcohol, helium, carbon dioxide, ammonia, and 1-methoxy-2-propanol.

7. The method of claim 1 wherein said liquid during said introducing removes particles off said front face and said back face.

8. The method of claim 7 wherein said particles are each substantially less than about 0.2 microns in diameter.

9. The method of claim 1 wherein said liquid is substantially free from particles greater than about 0.2 microns in diameter.

10. The method of claim 1 wherein said cleaning enhancement substance is mixed with a carrier gas, said carrier gas being selected from a group consisting of air, nitrogen, inert gas, and argon.

11. The method of claim 1 wherein said cleaning enhancement substance is mixed with a carrier gas, said carrier gas comprising said cleaning enhancement substance being mixed with said substantially particle free environment.

12. The method of claim 1 wherein said disk is at an angle from a vertical position.

13. The method of claim 12 wherein said angle is less than about 15 degrees.

14. The method of claim 1 wherein said disk is substantially free from oxidation before said immersing.

15. The method of claim 1 wherein said disk is a recently processed disk.

16. The method of claim 1 wherein said disk is substantially stationary during said providing and introducing steps, said substantially stationary disk is substantially free from mechanical movement.

17. The method of claim 1 wherein said cleaning enhancement substance is a trace amount of polar organic compound ranging in concentration from about 1,000 ppm and less.

18. The method of claim 1 wherein said cleaning enhancement substance is a trace amount of polar organic compound ranging in concentration from about 500 ppm and less.

19. The method of claim 1 wherein said disk is removed from said liquid at a rate of about 5.0 mm/sec. or less as measured from said front surface.

20. The method of claim 1 wherein said disk is removed from said liquid at a rate between about 0.25 mm/sec. and 5.0 mm./sec. as measured from said front surface.

21. The method of claim 1 wherein said disk is removed from said liquid at a rate between about 0.5 mm/sec. and 2.5 mm./sec. as measured from said front surface.

22. Apparatus for cleaning a hard disk, said apparatus comprising:
   a vessel adapted to immerse a disk in a liquid comprising water, said hard disk including a front face, a back face, an edge, and a center region;
   a supporting device for holding said disk by said center region, said supporting device being capable of moving in a first direction to immerse said disk in said liquid and in a second direction to remove said disk from said liquid;
   a first valve operably coupled to said vessel and adapted to provide a substantially particle free environment adjacent to said front face and said back face as said disk is being removed from said liquid; and a second valve operably coupled to said vessel and adapted to introduce a cleaning enhancement substance, said cleaning enhancement substance doping said liquid which is attached to said front face and said back face to cause a concentration gradient of said cleaning enhancement substance in said attached liquid to accelerate fluid flow of said attached liquid off of said disk.

23. Apparatus of claim 22 further comprising a controller operably coupled to a nozzle and adapted to introduce a drying source comprising a drying fluid from said nozzle, said drying fluid removing said liquid from said edge.

24. Apparatus of claim 23 wherein said second selected time is less than said first selected time.

25. Apparatus of claim 22 wherein said nozzle includes a first nozzle set and a second nozzle set, said first nozzle set being directed to pulse drying fluid to said edge and said front face for a first selected time, and said second nozzle set being directed to pulse drying fluid to a second said edge and said back face for a second selected time.

26. Apparatus of claim 25 wherein said second selected time is about two times or more than said first selected time.

27. Apparatus of claim 22 wherein said liquid is substantially free from particles greater than about 0.2 microns in diameter.

28. Apparatus of claim 22 wherein said cleaning enhancement substance is mixed with a carrier gas, said carrier gas being selected from a group consisting of air, inert gas, nitrogen, and argon.

29. Apparatus of claim 28 wherein said carrier gas is at a temperature ranging from about 70° F. to about 250° F.

30. Apparatus of claim 22 wherein said disk is at an angle from a vertical position.

31. Apparatus of claim 30 wherein said angle is less than about 15 degrees.

32. Apparatus of claim 22 wherein said disk is substantially free from oxidation.

33. Apparatus of claim 22 wherein said disk is a recently processed disk.

34. Apparatus of claim 22 wherein said disk is substantially stationary.

35. Apparatus of claim 22 wherein said cleaning enhancement substance is a trace amount of polar organic compound ranging in concentration from about 1,000 ppm and less.

36. Apparatus of claim 22 wherein said cleaning enhancement substance is a trace amount of polar organic compound ranging in concentration from about 500 ppm and less.

37. Apparatus of claim 22 wherein said supporting device is adapted to remove said disk from said liquid at a selected rate of about 5.0 mm/sec. or less as measured from said front surface.

38. Apparatus of claim 22 wherein said supporting device is adapted to remove said disk from said liquid at a selected rate between about 0.33 mm/sec. and 2.5 mm/sec. as measured from said front surface.

39. A computer program product for operating a cleaning apparatus, said computer program product comprising a computer readable memory including:

a first code that directs a supporting device for holding an object to move in a first direction to immerse said object in a liquid and in a second direction to remove said object from said liquid;

a second code that directs a first valve to provide a substantially particle free environment adjacent to a face of said object as said object is being removed from said liquid; and a third code that directs a second valve to introduce a cleaning enhancement substance, said cleaning enhancement substance doping said liquid which is attached to said face to cause a concentration gradient of said cleaning enhancement substance in said attached liquid to accelerate fluid flow of said attached liquid off of said object.

40. The computer program product of claim 39 further comprising a fourth code that directs a drying fluid to said object to remove any liquid from said object.

41. The computer program product of claim 39 further comprising a fifth code that directs a third valve to remove said any liquid from said object.

42. The computer program product of claim 39 further comprising a sixth code that directs said supporting device in a lateral direction to move said supporting device to a load or unload station.

43. The computer program product of claim 39 wherein said object is selected from a disk and a wafer.

* * * * *